(12) United States Patent
Horváth

(10) Patent No.: US 10,469,075 B2
(45) Date of Patent: Nov. 5, 2019

(54) LOW-RINGING OUTPUT DRIVER

(71) Applicant: Silicon Laboratories Inc., Austin, TX (US)

(72) Inventor: András V. Horváth, Budapest (HU)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/610,009

(22) Filed: May 31, 2017

(65) Prior Publication Data

US 2018/0351546 A1    Dec. 6, 2018

(51) Int. Cl.
*H03K 3/00* (2006.01)
*H03K 17/284* (2006.01)
*H03K 17/16* (2006.01)

(52) U.S. Cl.
CPC ......... *H03K 17/284* (2013.01); *H03K 17/163* (2013.01)

(58) Field of Classification Search
None
See application file for complete search history.

(56) References Cited

U.S. PATENT DOCUMENTS

| | | | | |
|---|---|---|---|---|
| 5,410,189 A | * | 4/1995 | Nguyen | H03K 19/01721 327/170 |
| 5,781,050 A | * | 7/1998 | Russell | H03K 17/164 327/108 |
| 6,586,973 B2 | * | 7/2003 | Yokoyama | H03K 5/159 327/108 |

* cited by examiner

*Primary Examiner* — Long Nguyen
(74) *Attorney, Agent, or Firm* — Zagorin Cave LLP

(57) ABSTRACT

A driver circuit has pre-driver and transistor pairs coupled in parallel paths with different delays in different paths allowing the driver to automatically adjust to load conditions, providing a moderate driver with low output ringing for low capacitive loads, while the added delay in the different paths is negligible when driving heavy capacitive loads. The driver circuit automatically scales drive strength of the output driver during switching transients to the load capacitance, providing a good trade-off between fast transient and low output ringing for a variety of different capacitive loads.

14 Claims, 5 Drawing Sheets

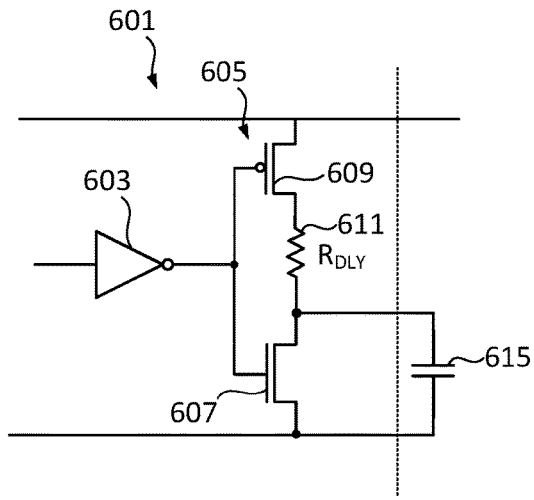
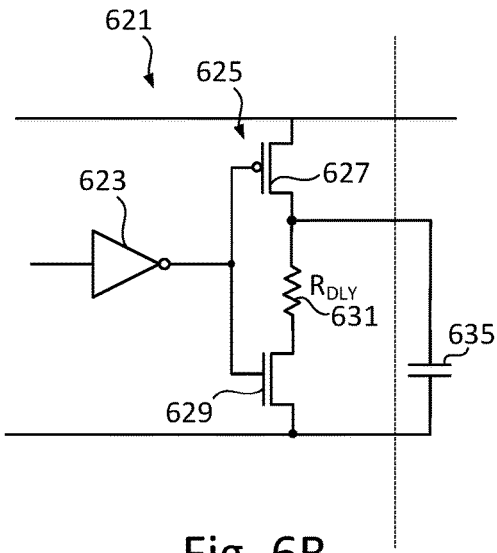
Fig. 6A            Fig. 6B
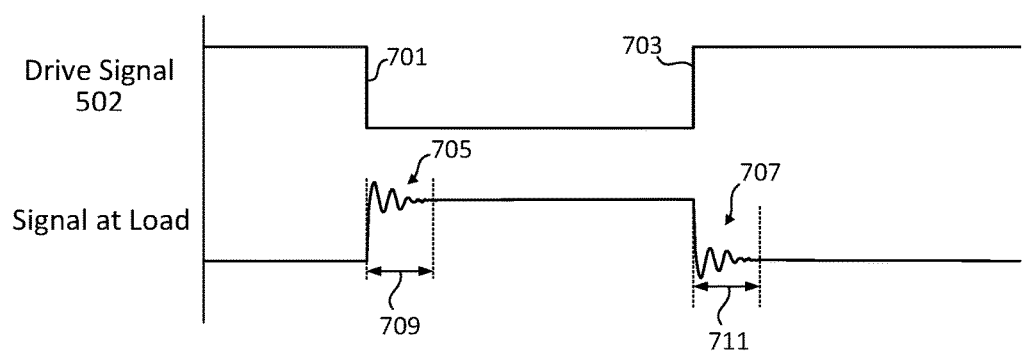
Fig. 7

LOW-RINGING OUTPUT DRIVER

BACKGROUND

Field of the Invention

This invention relates to output drivers and more particularly to output drivers that have low ringing.

Description of the Related Art

High-current gate drivers are designed to drive heavy capacitive loads. Switching high current in such drivers causes significant output voltage ringing when loaded with moderate loads instead of heavy capacitive loads. FIG. 1 shows a simplified block diagram of a standard output driver 100 that may be used as a high-current gate driver. FIG. 1 includes the parasitic inductances $L_{BW}$ from the bond wires and the inductance $L_{PCB}$ from the printed circuit board (PCB). The bond wires connect the die pads to the package terminals. The inductance $L_{PCB}$ is associated with electrical traces on the PCB.

When the driver turns on, PMOS transistor 101 turns on and NMOS transistor 103 turns off coupling the output node 105 to $V_{DD}$. When the driver 100 turns off, PMOS transistor 101 turns off and NMOS transistor 103 turns on discharging the output node 105 to ground. The parasitic inductances $L_{BW}$ and $L_{PCB}$ form a resonant circuit with the load capacitance $C_{LOAD}$ that affects driver operation at both turn-on and turn-off and results in significant transient overshoots and undershoots and ringing. Ringing refers to oscillation of the output signal that occurs in response to the driver circuit switching between on and off. Ringing settles to a steady state voltage over a period of time.

The higher the ratio between output current and load capacitance ($C_{LOAD}$), the faster the transient (shorter ringing duration), but higher ratios result in higher magnitude ringing appearing on the load. For low capacitive loads (small $C_{LOAD}$) a strong driver causes fast transients, but also very high amplitude ringing, which can damage the driven load (usually a switching field effect transistor (FET)) or even result in false operation because the high amplitude ringing causes the FET to switch when not desired.

The standard solution to reduce the ringing is to slow down turn-on/turn-off of the transistors in the driver. However, slowing down turn-on/turn-off increases the propagation delay of the driver. The core of a standard low-ringing driver is a slew-rate limited pre-driver. There are several ways to achieve slew rate limiting. Referring again to FIG. 1, a simple solution utilizes a serial resistor ($R_S$) 121 in the last stage of the pre-driver as shown in the N-side pre-driver 109. A circuit such as pre-driver 109 ensures fast turn-off but slow turn-on of the main NMOS transistor. The $R_S$ resistor together with the parasitic capacitance (Cgd and Cgs) provides the soft, low ringing turn-on of the main NMOS transistor. But this causes an extra turn-on delay, which is in the 2-20 ns range, even in the case of light capacitive loads. This extra delay is the "cost" of achieving low-ringing in the slew-rate limited pre-driver architecture. Accordingly, improvements in controlling ringing in drivers is desirable.

SUMMARY OF EMBODIMENTS OF THE INVENTION

Accordingly, a driver circuit automatically adjusts to load conditions providing low output ringing with low capacitive loads while maintaining performance for higher capacitive loads without increasing significantly the propagation delay of the driver.

In one embodiment, an output driver includes a first transistor that has a first gate coupled to a first drive signal. A first delay circuit is coupled to the first drive signal and is configured to generate a first delayed first drive signal that is delayed from the first drive signal by a first delay. A second transistor has a second gate coupled to the first delayed first drive signal. A second delay circuit is coupled to the drive signal and generates a second delayed first drive signal that is delayed from the first drive signal by a second delay, the second delay being longer than the first delay. A third transistor has a third gate coupled to the second delayed first drive signal.

In another embodiment, a method of operating a driver circuit includes delaying a first drive signal to generate a first delayed first drive signal with a first delay. A second delayed first drive signal is generated that is delayed from the first drive signal by a second delay that is longer than the first delay. The first drive signal controls a first transistor. The first delayed first drive signal controls a second transistor and the second delayed first drive signal controls a third transistor. An output node is controlled, at least in part, using the first, second, and third transistors.

In an embodiment, a driver circuit includes a plurality of pull-up transistors coupled in a first plurality of parallel paths to a first drive signal with respective ones of the first plurality of parallel paths having different delays. A plurality of pull-down transistors are coupled in a second plurality of parallel paths to a second drive signal with respective ones of the second plurality of parallel paths having different delays.

BRIEF DESCRIPTION OF THE DRAWINGS

The present invention may be better understood, and its numerous objects, features, and advantages made apparent to those skilled in the art by referencing the accompanying drawings.

FIG. 6A illustrates an embodiment of a delay circuit for the N pull-down array.

FIG. 6B illustrates an embodiment of a delay circuit for the P pull-up array.

FIG. 7 illustrates ringing associated with change in the drive signal.

The use of the same reference symbols in different drawings indicates similar or identical items.

DETAILED DESCRIPTION

Figure 1:
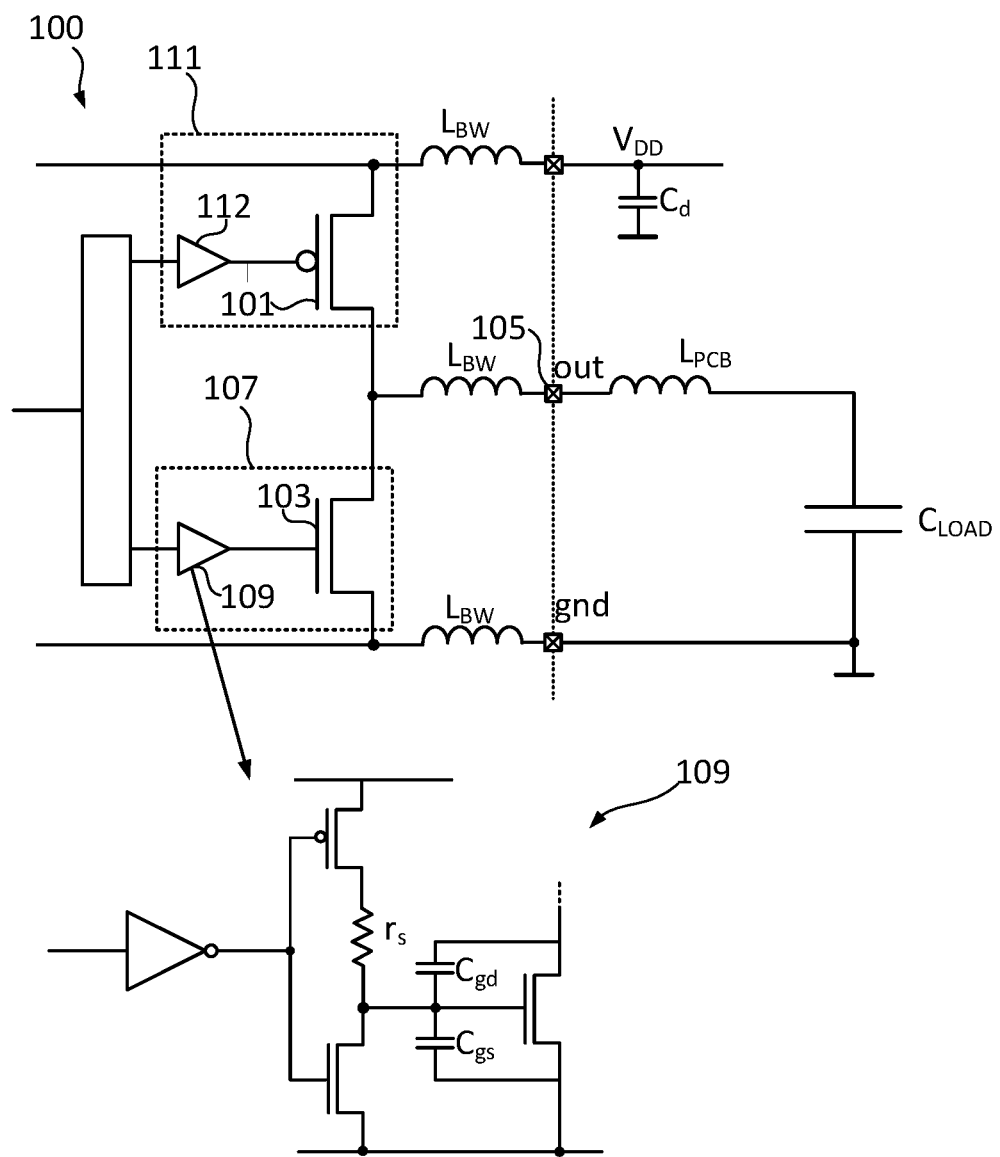
FIG. 1 shows a simplified block diagram of a standard output driver.
Figure 2:
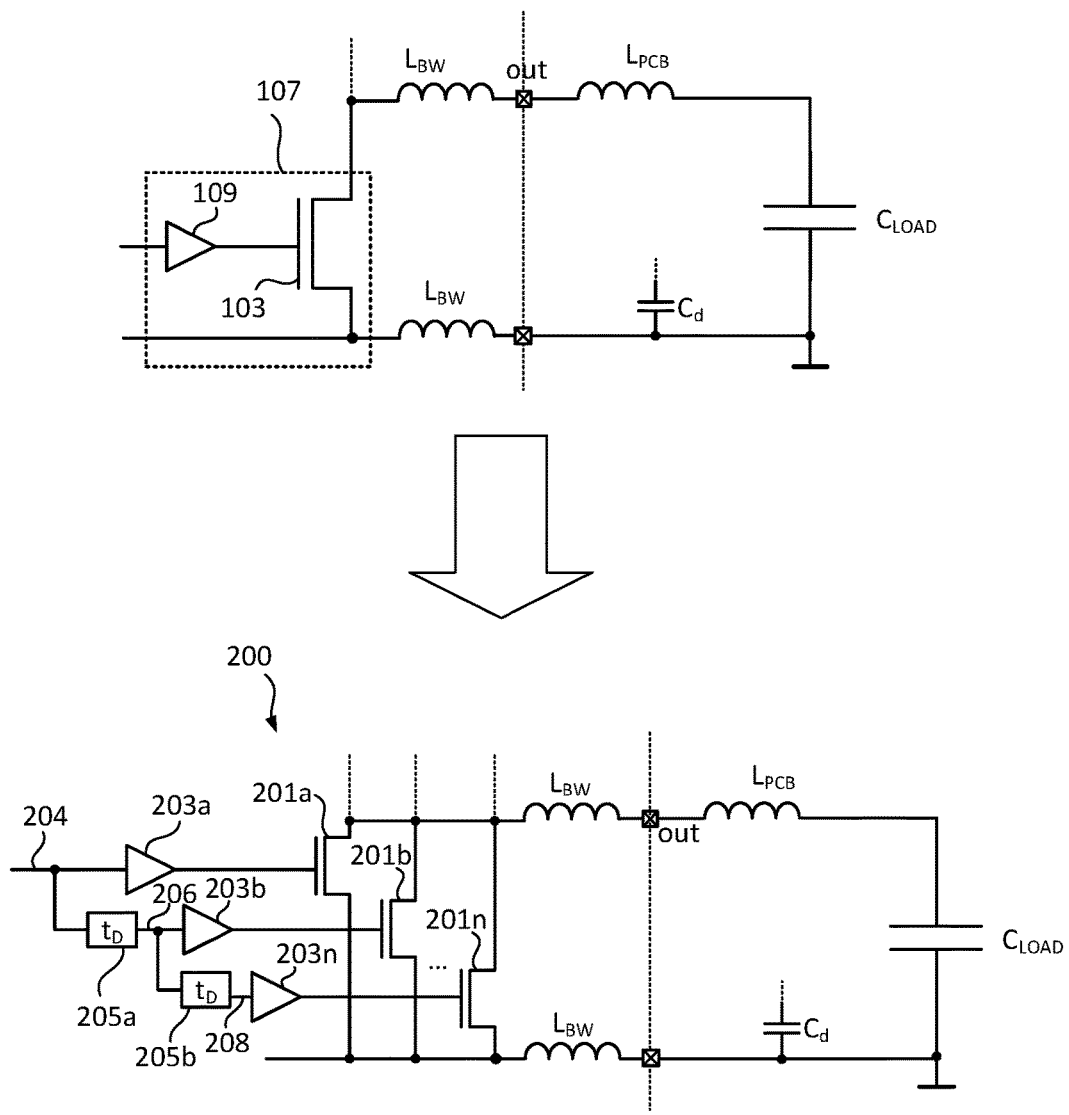
FIG. 2 illustrates transformation of the pull-down section of a standard output driver that splits the output transistor and the corresponding pre-driver into an array of transistors and pre-drivers with different delays.

FIG. 2 illustrates an embodiment that avoids high amplitude ringing for low capacitive loads but still maintains sufficient drive for high capacitive loads. FIG. 2 illustrates how the pull-down section of the driver 107 is transformed by splitting the output transistor 103 and the corresponding pre-driver 109 into an array of N-channel metal oxide semiconductor (NMOS) transistors and pre-drivers. Thus, transistors 201a, 201b, and 201n replace the NMOS transistor 103. Pre-drivers 203a, 203b, and 203n replace the pre-driver 109. The pre-driver circuits include chains of inverters with the first inverters in the chain being small and the last inverter in the chain being large so as to be able to drive the large output transistor fast enough. The array of drivers and pre-drivers form parallel paths. The parallel paths have different amounts of delay. The result is sequencer driven transistor array. In the embodiment of FIG. 2, pre-driver circuit 203a receives drive signal 204 and drives transistor 201a without additional delay inserted. Delay circuit 205a receives the drive signal 204 and supplies a delayed drive signal 206 to pre-driver circuit 203b, which in turn drives transistor 201b. Delay circuit 205b receives the delayed drive signal 206 and supplies a twice delayed drive signal 208 to pre-driver circuit 203n, which in turn drives transistor 201n. Given the driver array shown in FIG. 2, transistor 201a turns on/off first, followed in sequence by transistor 201b, and then transistor 201n. While three transistors are shown in FIG. 2 for ease of illustration, other embodiments utilize a different number of transistors suitable for the particular application in which the driver circuit is being used.

Figure 3:
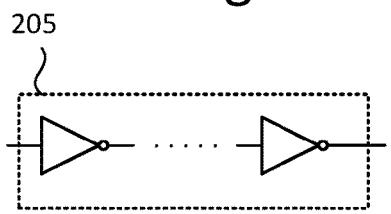
FIG. 3 illustrates an example of a delay circuit.

FIG. 3 shows an embodiment of the delay circuit implemented as a plurality of inverters that may be used for delay circuits 205a or 205b. There may be two or more inverters in each of the delay circuits. Of course, other delay circuit implementations can be used. In an embodiment, each delay circuit provides approximately 1-10 nanoseconds of delay. Other delay lengths may of course be used. Note that while the delay circuits in the parallel paths may have approximately the same delay, other embodiments may use different delay circuits for different parallel paths. Thus, delay circuit 205a and 205b may have different delays.

Figure 4:
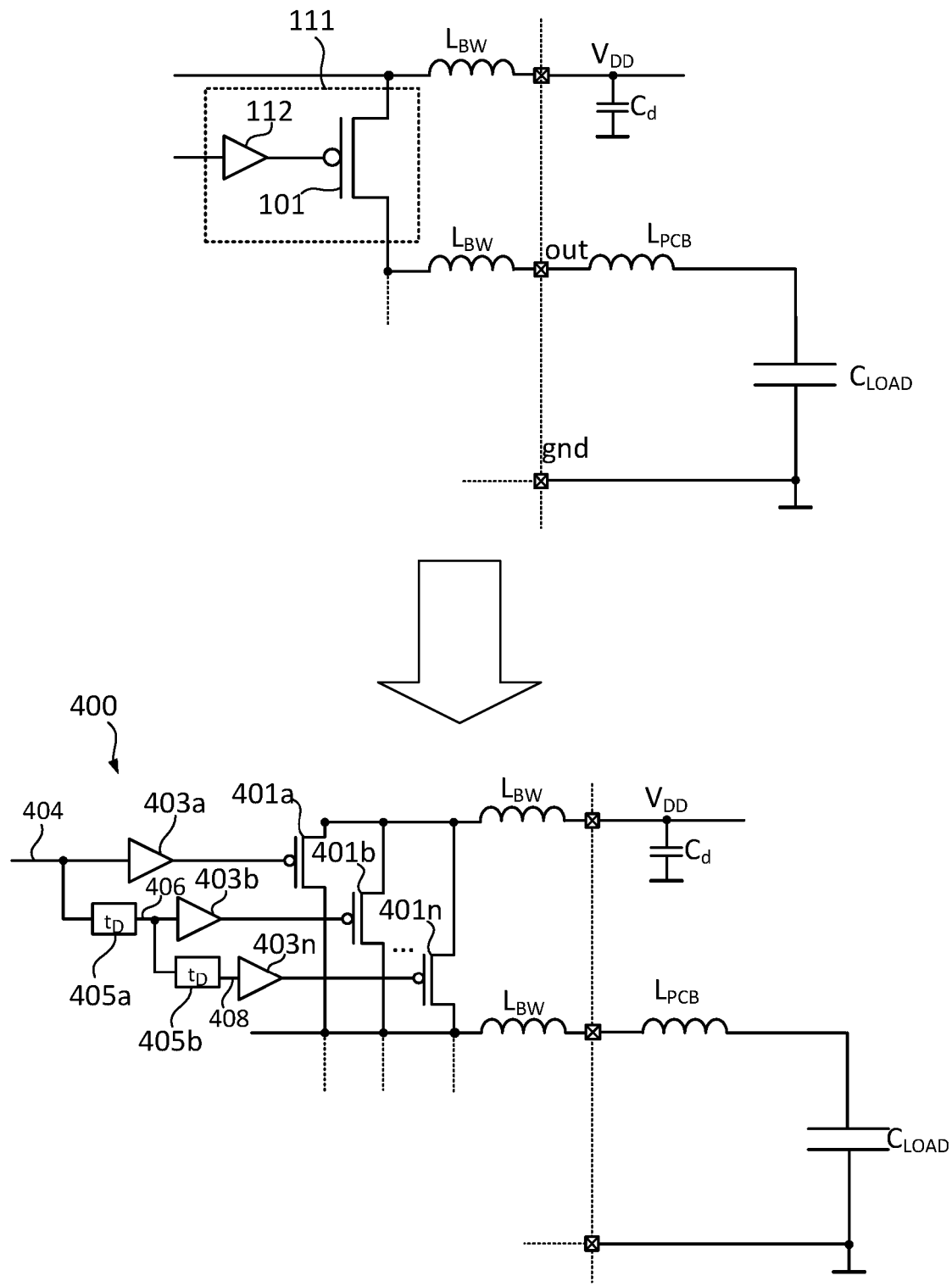
FIG. 4 illustrates transformation of the pull-up section of an output driver that splits the output transistor and the corresponding pre-driver into an array of transistors and pre-drivers with different delays.

FIG. 4 illustrates the pull-up half of the driver circuit (the P-channel metal oxide semiconductor (PMOS) half) of the circuit. FIG. 4 illustrates how the pull-up section of the driver 111 is transformed by splitting the output transistor 101 and the corresponding pre-driver 112 into an array of transistors and pre-drivers. Thus, transistors 401a, 401b, and 401n replace the PMOS transistor 101. Pre-driver circuits 403a, 403b, and 403n replace the pre-driver circuit 112. The array of drivers and pre-drivers form parallel paths having different delays. The result is sequencer driven PMOS transistor array. In the embodiment of FIG. 4, pre-driver circuit 403a receives drive signal 404 and drives transistor 401a without additional delay. Delay circuit 405a receives drive signal 404 and supplies a delayed drive signal 406 to pre-driver circuit 403b, which in turn drives transistor 401b. Delay circuit 405b receives delayed drive signal 406 and supplies a twice delayed drive signal 408 to pre-driver circuit 403n, which in turn drives transistor 401n. Given the delays shown in FIG. 4, transistors 401a turns on/off first, followed in sequence by transistor 401b, and then transistor 401n. While three transistors are shown in FIG. 4, other embodiments use a different number of transistors. Note that the capacitance $C_d$ shown in FIG. 4 and various of the other figures is a decoupling capacitor and plays a role in the turn-on transient when the pullup PMOS transistor 101 charges the external load to $V_{DD}$. The turn-on transient is much faster than the power supply regulator. The decoupling capacitor helps ensure that the load capacitance receives sufficient charging current without a significant drop of $V_{DD}$. In practice $C_d$ is at least ten times higher than the capacitance of the load. The decoupling capacitor charges back up using a DC current from the power supply when the pullup PMOS transistor is off.

Figure 5A:
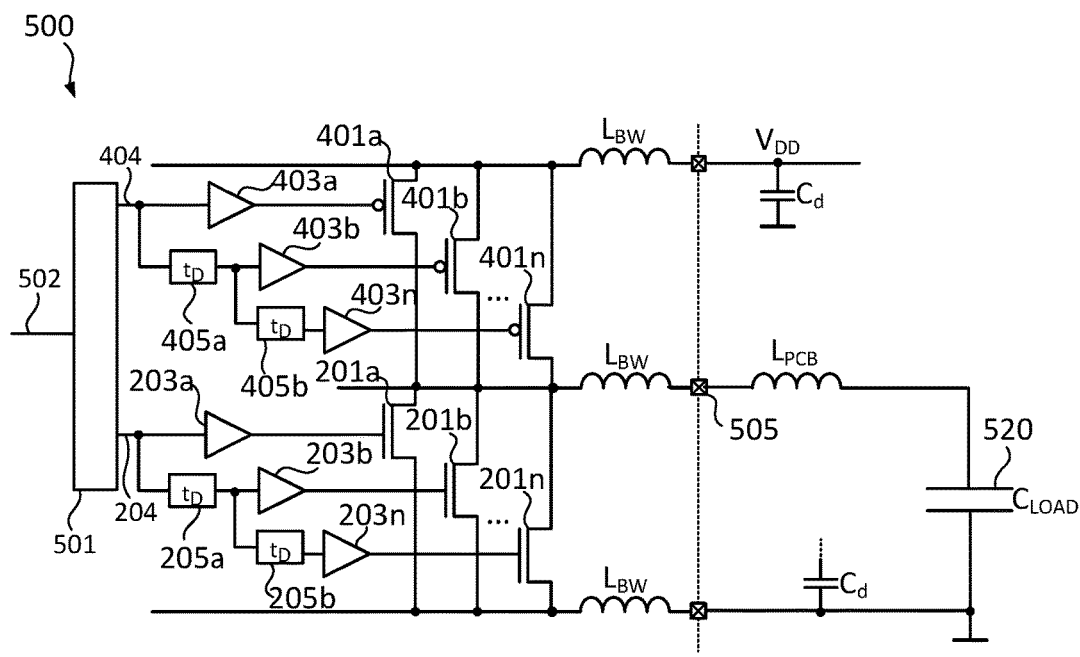
FIG. 5A illustrates the pull-up section and pull-down section of an output driver with each section having an array of transistors and pre-drivers forming parallel paths with different delays.

FIG. 5A illustrates an embodiment of the driver circuit 500 showing both the pull-up array portion including PMOS transistors 401a, 401b, and 401n and the pull-down array portion including NMOS transistors 201a, 201b, and 201n. The embodiment of FIG. 5A needs to avoid short circuit current by ensuring that the pull-up portion of the driver circuit and the pull-down portion of the driver circuit are not on at the same time. For example, assuming driver 500 is inverting with respect to drive signal 502, and signal 502 switches from high to low cause charging current to be supplied to the load, the NMOS transistors need to turn off before the PMOS transistors turn on, thereby avoiding short circuit current during the transition. Similarly, if drive signal 502 switches from low to high to discharge the output node 505 to ground, the PMOS transistors need to turn off before the NMOS transistors turn on, thereby avoiding short circuit current during the transition.

Figure 5B:
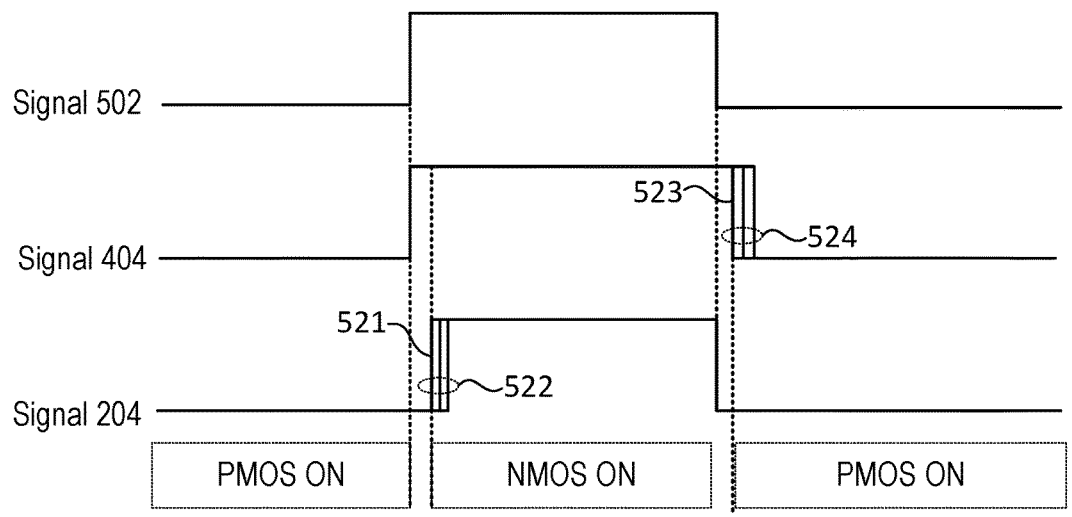
FIG. 5B illustrates the operation of the control block 501 providing signal separation for driving the PMOS and NMOS driver transistors.

FIG. 5B illustrates the function of control block 501. Control block 501 provides non-overlap separation from a single input signal 502. The control block 501 creates two separate outputs (404 and 204). As shown in FIG. 5B, the control block ensures that the low to high transition of signal 204 at 521 and the high to low transition of 404 at 523 are delayed from the corresponding edges of signal 502. That ensures that that the main driver transistors are not ON in the same time. In other words, the turn-off of the PMOS transistors finishes before the NMOS transistors turn on and the turn-off of the NMOS transistor finishes before the PMOS transistors turn on. FIG. 5B also illustrates the staggered turn-on of the NMOS transistors (201a, 201b, 201n) at 522 and the staggered turn-on of the PMOS transistors (401a, 401b, 401n) at 524.

FIG. 6A illustrates an embodiment of an N array pre-driver delay cell 601 used for the N array pre-driver delay circuits 205a and 205b. The delay cell 601 includes two inverters 603 and 605. The second inverter stage 605 is an asymmetric stage having a standard pulldown transistor 607, a weak pull-up transistor 609, and a resistance 611 ($R_{DLY}$) between the transistors. The weak pull-up transistor together with the input capacitance 615 of the pre-driver following the delay provides a delay function at the low to high transition of the delay stage. However, at the high to low transition, the strong pull-down transistor 607 ensures a fast response with much less delay as compared to the low to high transition.

FIG. 6B illustrates the P array pre-driver cell 621 used for the P pre-driver delay circuits 405a and 405b. The delay cell 621 includes two inverters 623 and 625. The second inverter stage 625 is an asymmetric stage having a standard pull-up transistor 627, a weak pull-down transistor 629, and a resistance 631 ($R_{DLY}$) between the transistors. The weak pull-down transistor together with the input capacitance 635 of the pre-driver following the delay provides a delay function at the high to low transition of the delay stage. However, at the low to high transition, the strong pull-up transistor 627 in the delay circuit ensures a fast response with much less delay as compared to the high to low transition. That helps ensure that at the low to high transition of the driver circuit, the NMOS output array turns off quickly and the PMOS array turns on slowly. At the high to low transition, the PMOS array turns off quickly while the NMOS array turns on slowly. That helps ensure that short circuit currents do not occur.

For the driver circuit 500, for low capacitive loads (for example up to 100 pF capacitance) only the first (direct driven) signal driver works. Referring to FIGS. 5 and 7, when the drive signal 502 switches from high to low at 701 or low to high at 703, ringing 705 or 707 occurs at the output signal seen at the load 520. When $C_{LOAD}$ is a low load, the duration 709 or 711 of the whole high to low (or low to high) transient is over in, e.g., 2-3 nanoseconds. That allows time for only transistors 401a and 201a to turn on/off, and the rest of the output transistors 401b, 401n, 201b, 201n turn on/off after the transient is completed. However, when the load is higher, additional transistors can take part of the output driving. For heavier loads (for example up to approximately 100 nF) the transients 709 and 711 last longer (take longer to settle), e.g., up to hundreds of nanoseconds. For heavy loads, e.g., between hundreds of pF and 100 nF, all the transistors in the driver have time to turn on/off to drive the load relatively early in the transient. For example, for drivers with five levels of delays, all the transistors have switched after 25 ns (assuming 5 ns for each level of delay). For a transient lasting 250 nanoseconds, all the transistors switch in the first approximately 10 percent of the transient. For some intermediate loads of hundreds of pF (resulting, e.g., in transients lasting 10-15 ns), some but not all of the output transistors turn on/off to drive during the transient. The number of transistors that turn on/off before the end of the transient depends on such factors as the number of parallel paths, size of transistors, the length of the various delays in the parallel paths, and the capacitive load.

The use of the pre-driver and transistor arrays with different delays in different paths results in a moderate driver for low loads, while the added delay is negligible when driving heavy loads. The driver circuit 500 automatically scales drive strength of the output driver to the load capacitance during switching transients, providing a good trade-off between fast transient and low output ringing for a variety of different capacitive loads.

Thus, various aspects have been described relating to an output driver that automatically adapts to different capacitive loads. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An output driver comprising:
   a pull-down portion including,
      a first transistor having a first gate coupled to a first drive signal;
      a first delay circuit coupled to the first drive signal and configured to generate a first delayed first drive signal that is delayed from the first drive signal by a first delay;
      a second transistor having a second gate coupled to the first delayed first drive signal;
      a second delay circuit coupled to the first drive signal to generate a second delayed first drive signal that is delayed from the first drive signal by a second delay, the second delay being longer than the first delay;
      a third transistor having a third gate coupled to the second delayed first drive signal;
      wherein the first and second delay circuits each include a first inverter stage coupled to a second inverter stage, the second inverter stage being an asymmetric stage including a second stage pull-up transistor, a second stage pull-down transistor, the second stage pull-up transistor being weaker than the second stage pull-down transistor thereby causing an output of the second inverter stage to switch from high to low faster than switching from low to high;
   a pull-up portion including,
      a fourth transistor having a fourth gate coupled to a second drive signal;
      a third delay circuit coupled to receive the second drive signal and to generate a first delayed second drive signal that is delayed from the second drive signal by a third delay;
      a fifth transistor having a fifth gate coupled to the first delayed second drive signal;
      a fourth delay circuit coupled to the second drive signal to generate a second delayed second drive signal that is delayed from the second drive signal by a fourth delay, the fourth delay being longer than the third delay;
      a sixth transistor having a sixth gate coupled to the second delayed second drive signal; and
      wherein the third and fourth delay circuits each include a third inverter stage coupled to a fourth inverter stage, the fourth inverter stage being an asymmetric stage including a fourth stage pull-up transistor and a fourth stage pull-down transistor, the fourth stage pull-up transistor being stronger than the fourth stage pull-down transistor thereby causing an output of the fourth inverter stage to switch from low to high faster than switching from high to low.

2. The output driver, as recited in claim 1, wherein the second delay circuit is coupled to the first drive signal through the first delay circuit.

3. The output driver, as recited in claim 1, further comprising:
   a first pre-driver circuit disposed between the first gate and the first drive signal;
   a second pre-driver circuit disposed between the second gate and the first delayed first drive signal; and
   a third pre-driver circuit disposed between the third gate and the second delayed first drive signal.

4. The output driver, as recited in claim 1, wherein the fourth delay circuit is coupled to the second drive signal through the third delay circuit.

5. The output driver, as recited in claim 1, further comprising:
   an output node;
   wherein the first, second, and third transistors are coupled between the output node and a first voltage node; and
   wherein the fourth, fifth, and sixth transistors are coupled between the output node and a second voltage node.

6. The output driver, as recited in claim 5,
   wherein the first voltage node is a low voltage node and the second voltage node is a high voltage node; and
   wherein the first, second, and third transistors are NMOS transistors and the fourth, fifth, and sixth transistors are PMOS transistors.

7. The output driver, as recited in claim 1, further comprising:
- a fourth pre-driver circuit disposed between the fourth gate and the second drive signal;
- a fifth pre-driver circuit disposed between the fifth gate and the first delayed second drive signal; and
- a sixth pre-driver circuit disposed between the sixth gate and the second delayed second drive signal.

8. The output driver, as recited in claim 5, wherein for a low capacitance load of up to approximately 100 pF coupled to the output node, responsive to the first drive signal changing from a first voltage level to a second voltage level, the first transistor activates before a switching transient seen at the low capacitance load is completed and wherein the third transistor does not activate before the switching transient is completed.

9. The output driver, as recited in claim 5, wherein for a high capacitance load of between hundreds of pF and approximately 100 nF coupled to the output node, responsive to the first drive signal changing from a first voltage level to a second voltage level, the first, second, and third transistors activate before a switching transient seen at the high capacitance load is completed.

10. The output driver as recited in claim 1 wherein the fourth delay circuit is coupled to the second drive signal through the third delay circuit.

11. The output driver as recited in claim 1 wherein the pull-up portion and the pull-down portion are not on at the same time.

12. The output driver as recited in claim 1 further comprising:
- a drive signal control block coupled to receive a drive signal and configured to generate the first drive signal and the second drive signal such that a low to high transition of the first drive signal is delayed from a low to high transition of the drive signal and a high to low transition of the second drive signal is delayed from a high to low transition of the drive signal.

13. A driver circuit comprising:
- a plurality of pull-up transistors coupled in a first plurality of parallel paths to a first drive signal and to a driver output node, with respective ones of the first plurality of parallel paths having different delays;
- wherein one of the first plurality of parallel paths includes a first delay circuit; and
- wherein another of the first plurality of parallel paths includes the first delay circuit and a second delay circuit;
- wherein each of the first and second delay circuits include a first inverter stage coupled to a second inverter stage, the second inverter stage being an asymmetric stage including a second stage pull-up transistor, a second stage pull-down transistor, and a first resistor disposed between second stage pull-up transistor and the second stage pull-down transistor, the second stage pull-up transistor being stronger than the second stage pull-down transistor thereby causing an output of the second inverter stage to switch from low to high faster than switching from high to low independent of a voltage on the driver output node; and
- a plurality of pull-down transistors coupled in a second plurality of parallel paths to a second drive signal and to the driver output node, with respective ones of the second plurality of parallel paths having different delays;
- wherein one of the second plurality of parallel paths includes a third delay circuit; and
- wherein another of the second plurality of parallel paths includes the third delay circuit and a fourth delay circuit;
- wherein each of the third and fourth delay circuits include a third inverter stage coupled to a fourth inverter stage, the fourth inverter stage being an asymmetric stage including a fourth stage pull-up transistor, a fourth stage pull-down transistor, and a second resistor disposed between fourth stage pull-up transistor and the fourth stage pull-down transistor, the fourth stage pull-up transistor being weaker than the fourth stage pull-down transistor thereby causing an output of the fourth inverter stage to switch from high to low faster than switching from low to high independent of the voltage on the driver output node.

14. The driver circuit, as recited in claim 13, further comprising:
- a first plurality of pre-driver circuits coupled in respective ones of the first plurality of parallel paths; and
- a second plurality of pre-driver circuits coupled in respective ones of the second plurality of parallel paths.

* * * * *